(12) United States Patent
Yamauchi

(10) Patent No.: US 6,898,111 B2
(45) Date of Patent: May 24, 2005

(54) SRAM DEVICE

(75) Inventor: Hiroyuki Yamauchi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 224 days.

(21) Appl. No.: 10/179,980

(22) Filed: Jun. 26, 2002

(65) Prior Publication Data

US 2003/0002328 A1 Jan. 2, 2003

(30) Foreign Application Priority Data

Jun. 28, 2001 (JP) .......................................... 2001-196109

(51) Int. Cl.⁷ .............................................. G11C 11/00
(52) U.S. Cl. ...................................... 365/154; 365/156
(58) Field of Search ................................ 365/154, 156; 257/408

(56) References Cited

U.S. PATENT DOCUMENTS

| | | | |
|---|---|---|---|
| 5,047,979 A | * | 9/1991 | Leung ........................ 365/156 |
| 5,065,363 A | | 11/1991 | Sato et al. |
| 5,365,475 A | * | 11/1994 | Matsumura et al. ........ 365/154 |
| 5,744,844 A | | 4/1998 | Higuchi ...................... 257/903 |
| 5,774,393 A | * | 6/1998 | Kuriyama .................... 365/154 |
| 5,930,163 A | | 7/1999 | Hara et al. .................. 365/154 |
| 6,121,666 A | * | 9/2000 | Burr ............................ 257/408 |
| 6,240,009 B1 | | 5/2001 | Naffziger et al. ........... 365/154 |
| 6,363,006 B2 | * | 3/2002 | Naffziger et al. ........... 365/156 |

FOREIGN PATENT DOCUMENTS

| | | |
|---|---|---|
| JP | 02-187991 | 7/1990 |
| JP | 08-329681 | 12/1996 |

* cited by examiner

*Primary Examiner*—Trong Phan
(74) *Attorney, Agent, or Firm*—McDermott Will & Emery LLP

(57) ABSTRACT

In a CMOS type SRAM device having a 6-transistor configuration, only a drive transistor and an access transistor of one unit circuit are designed with a larger size, with the other four transistors having a smaller size.

13 Claims, 6 Drawing Sheets

|  | FIRST UNIT | | | SECOND UNIT | | |
|---|---|---|---|---|---|---|
|  | MP0 | MN0 | MN2 | MP1 | MN1 | MN3 |
| GATE WIDTH ($\mu$m) | 0.2 | 0.2 | 0.2 | 0.2 | 0.4 | 0.4 |
| GATE LENGTH ($\mu$m) | 0.15 | 0.15 | 0.15 | 0.15 | 0.15 | 0.15 |
| THRESHOLD VOLTAGE (V) | 0.5 | 0.5 | 0.5 | 0.5 | 0.4 | 0.4 |
| INVERTER INVERSION THRESHOLD LEVEL | LINV:0.3Vcc | | | RINV:0.15Vcc | | |

FIG. 3

|  | FIRST UNIT ||| SECOND UNIT |||
|---|---|---|---|---|---|---|
|  | MP0 | MN0 | MN2 | MP1 | MN1 | MN3 |
| GATE WIDTH ($\mu$m) | 0.2 | 0.2 | 0.2 | 0.2 | 0.4 | 0.4 |
| GATE LENGTH ($\mu$m) | 0.15 | 0.15 | 0.15 | 0.15 | 0.15 | 0.15 |
| THRESHOLD VOLTAGE (V) | 0.5 | 0.5 | 0.5 | 0.2 | 0.2 | 0.2 |
| LEAK CURRENT (RELATIVE VALUES) | 5 | 5 | 5 | 5000 | 5000 | 5000 |

FIG. 4

|  | FIRST UNIT ||| SECOND UNIT |||
|---|---|---|---|---|---|---|
|  | MP0 | MN0 | MN2 | MP1 | MN1 | MN3 |
| GATE WIDTH ($\mu$m) | 0.2 | 0.2 | 0.2 | 0.2 | 0.4 | 0.4 |
| GATE LENGTH ($\mu$m) | 0.15 | 0.15 | 0.15 | 0.15 | 0.15 | 0.15 |
| GATE OXIDE FILM (nm) | 2.6 | 2.6 | 2.6 | 1.6 | 1.6 | 1.6 |
| LEAK CURRENT (RELATIVE VALUES) | 5 | 5 | 5 | 5000 | 5000 | 5000 |

|  | Vss1(V) | Vss2(V) | Vm(V)@WL:High | RBL(V) | WBL(V) |
|---|---|---|---|---|---|
| READ WLR="H" WLWT="L" | 0.2 | 0.0 | Vcc @"H" | Vcc | — |
|  |  |  | 0.4(max)@"L" | Vcc−ΔV | — |
| WRITE WLWT="H" WLR="H" | 0.0 | 0.2 | Vcc @"H" | Vcc | 0.0 |
|  | 0.2 | 0.0 | 0.0 @"L" | 0.0 | Vcc |

SRAM DEVICE

BACKGROUND OF THE INVENTION

The present invention relates to an SRAM (static random access memory) device in which memory cells can be arranged with a high density.

A CMOS type SRAM device having a 6-transistor configuration is known in the art. Such an SRAM device includes two unit circuits, each including a PMOS load transistor, an NMOS drive transistor and an NMOS access transistor. The PMOS load transistor and the NMOS drive transistor together form an inverter, and the NMOS access transistor connects the output of the inverter to a bit line. The two unit circuits are coupled together by connecting the input and the output of one inverter with those of the other inverter in a cross-coupled manner.

An SRAM device described in U.S. Pat. No. 5,744,844 (first conventional example) employs a lateral-type cell structure in which the PMOS load transistor of each unit is provided in an N-well region that is located in a central area of a memory cell region, the NMOS drive transistor and the NMOS access transistor of the first unit in a left-side P-well region, and the NMOS drive transistor and the NMOS access transistor of the second unit in a right-side P-well region. In this way, the access speed can be increased while the cell area can be reduced, as compared with a conventional longitudinal-type cell structure having an N-well region in the upper half of each memory cell region and a P-well region in the lower half thereof. Herein, the longitudinal direction is defined as the direction in which bit lines extend, and the lateral direction as the direction in which word lines extend. U.S. Pat. No. 5,930,163 discloses a similar technique.

An SRAM device described in U.S. Pat. No. 6,240,009 (second conventional example) is a 6-transistor SRAM memory cell intended for a single-ended read, differential write operation, in which the gate width of the NMOS drive transistor of one unit is set to be smaller than that of the other unit so as to reduce the cell area.

In a 6-transistor SRAM memory cell, the cell current that flows from a bit line to a source line is determined by the channel width of the NMOS drive transistor and the NMOS access transistor. A smaller cell current means a greater bit line amplification delay. However, in the first conventional example, the two unit circuits are symmetric in terms of the size of the constituent transistors, whereby in order to increase the cell current to reduce the bit line amplification delay so as to realize a faster operation, it is necessary to increase the size of all of the six transistors, which leads to a substantial increase in the cell area. In the second conventional technique, the NMOS access transistors of the two units have the same gate width, whereby the current driving power of the NMOS drive transistor having a large gate width cannot be fully made use of.

SUMMARY OF THE INVENTION

An object of the present invention is to provide a new and improved SRAM device.

A first SRAM device of the present invention is characterized in that the drive transistor and the access transistor of one unit circuit have substantially the same channel width (gate width), and the channel width is larger than that of the drive transistor and the access transistor of the other unit circuit. In this way, it is possible to ensure a large cell current, thereby reducing the bit line amplification delay. Furthermore, if the channel width ratio between the load transistor and the drive transistor of one unit circuit and that of the other unit circuit are set to be different from each other by 15% or more, for example, it is possible to prevent stored data from being lost by potential floating due to a cell current during a read operation.

A second SRAM device of the present invention is characterized in that the two unit circuits are asymmetric with each other in terms of the magnitude of an off leak current of the inverter. In this way, it is possible to reduce the leak current of the SRAM device on standby, while ensuring a large cell current in one unit circuit.

A third SRAM device of the present invention is characterized in that the two unit circuits are asymmetric with each other in terms of the thickness of the gate oxide film of the constituent transistors. In this way, it is possible to reduce the gate leak current of the SRAM device on standby, while ensuring a large cell current in one unit circuit.

A fourth SRAM device of the present invention is characterized in that: a bit line connected to one of the two unit circuits is used only for write operations, whereas a bit line connected to the other unit circuit is used for both read and write operations; the current driving power of at least one of the constituent transistors of one of the unit circuits that is connected to the write-only bit line is set to be lower than that of corresponding one of the constituent transistors of the other unit circuit; and the access transistors of the two unit circuits are configured so that only one of the access transistors is activated during a read operation, whereas both of the access transistors are activated during a write operation. In this way, it is possible to realize a single-ended read, differential write operation.

A fifth SRAM device of the present invention is characterized in that: the two unit circuits are asymmetric with each other in terms of the current driving power of the constituent transistors; and the SRAM device further includes means for setting, during a read operation, the potential level of the source line of one of the two unit circuits of the lower current driving power to be higher than that of the source line of the other unit circuit. In this way, it is possible to prevent stored data from being lost by potential floating due to a cell current during a read operation, while ensuring a large cell current in one unit circuit.

A sixth SRAM device of the present invention is characterized in that in each of the two unit circuits, the drive transistor and the access transistor have substantially the same channel width and are formed in the same continuous rectangular-shaped active region with no bent portions. In this way, the stress in the active region is reduced, thereby preventing a defect from occurring.

BRIEF DESCRIPTION OF THE DRAWINGS

FIG. 3 is a chart showing another exemplary value of the threshold voltage of each transistor in FIG. 1.

FIG. 4 is a chart showing an exemplary value of the thickness of the gate oxide film of each transistor in FIG. 1.

DETAILED DESCRIPTION OF THE INVENTION

Figures 1, 2:
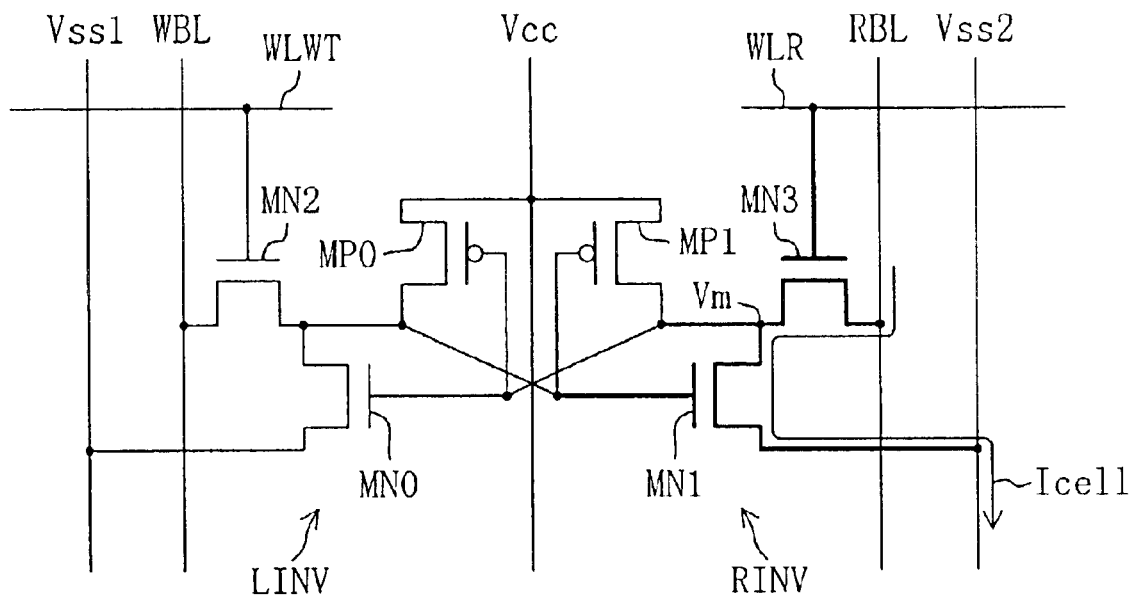
FIG. 1 is a circuit diagram illustrating a configuration of an SRAM device of the present invention.
FIG. 2 is a chart showing exemplary values of the size and the threshold voltage of each transistor in FIG. 1.

FIG. 1 illustrates an exemplary configuration of an SRAM device of the present invention. Referring to FIG. 1, the SRAM device includes PMOS load transistors MP0 and MP1, NMOS drive transistors MN0 and MN1, and NMOS access transistors MN2 and MN3. MP0, MN0 and MN2 together form a first unit circuit. MP0 and MN0 together form an inverter (left inverter LINV), and the output of the inverter is connected to a write-only bit line (write bit line) WBL by MN2. The gate of MN2 is connected to a write-only word line (write word line) WLWT, and the source of MN0 is connected to a first source line Vss1. MP1, MN1 and MN3 together form a second unit circuit. MP1 and MN1 together form an inverter (right inverter RINV), and the output of the inverter (i.e., an intermediate node Vm) is connected to a read/write bit line (read bit line) RBL by MN3. The gate of MN3 is connected to a read/write word line (read word line) WLR, and the source of MN1 is connected to a second source line Vss2. The first unit circuit and the second unit circuit are coupled together so that the input and the output of the inverter of one unit circuit are cross-coupled with those of the inverter of the other unit circuit, and the sources of MP0 and MP1 are connected commonly to a positive power supply line Vcc. In FIG. 1, "Icell" denotes a cell current that flows from RBL to Vss2 via MN3 and MN1.

FIG. 2 shows exemplary values of the size and the threshold voltage of each transistor in FIG. 1. As shown in FIG. 2, MN1 and MN3 have a gate width (channel width) that is twice that of the other four transistors. Thus, MN1 and MN3 have the same gate width, and the gate width is larger than that of MN0 and MN2. MN1 and MN3 have a low threshold voltage (0.4 V), and the other four transistors have a high threshold voltage (0.5 V). During a write operation, a peripheral write driver circuit forcibly pulls in a bit line, which is connected to the side of the node to which "L" is to be written, to the ground level, whereby the transistors of the memory cell themselves do not need a large size. Therefore, a write operation can sufficiently be performed with each transistor of the first unit, which is connected to WBL, having a size that is one half of that of the transistors of the second unit.

The inversion threshold level of the inverter of each unit is determined by the current driving power ratio between the load transistor and the drive transistor. Referring to FIG. 2, the gate width ratio between MP0 and MN0 is 1.0 (=0.2 $\mu$m/0.2 $\mu$m), and the gate width ratio between MP1 and MN1 is 0.5 (=0.2 $\mu$m/0.4 $\mu$m), indicating a 50% difference between the gate width ratios. As a result, the inversion threshold level of the left inverter LINV is 0.3 Vcc, and that of the right inverter RINV is 0.15 Vcc, indicating a 50% difference between the inversion threshold levels.

The example of FIG. 2 is characterized in that the gate widths of MN1 and MN3 are set to be large and equal to each other in order to increase the cell current Icell flowing through the transistors (MN1 and MN3). However, when the size of these transistors is increased, the potential at the node Vm significantly changes from an "L" level to an "H" level when MN3 is turned ON during a read operation. Therefore, the inversion threshold level of the left inverter LINV needs to be shifted to a higher level so that the left inverter LINV, which uses the potential at the node Vm as its input, is not inverted in error. In view of this, the channel width ratio between the load transistor and the drive transistor of one unit and that of the other unit have a 50% difference therebetween as described above, thereby preventing the erroneous inversion of the left inverter LINV.

Moreover, referring to FIG. 2, the threshold voltages of the constituent transistors of one unit circuit are set to be asymmetric with those of the other unit circuit, whereby the following effect can be expected. Specifically, among the six transistors, only those of the second unit, which require a higher current driving power, are designed with a lower threshold voltage, while those of the first unit are designed with a higher threshold voltage, whereby the cell leak current can be reduced to half as compared with a case where all of the six transistors are designed with a low threshold voltage.

Note that the advantages of this configuration can be obtained as long as the channel width ratio between the load transistor and the drive transistor of one unit circuit and that of the other unit circuit are different from each other by 15% or more. Moreover, the advantages of this configuration can be obtained as long as the inversion threshold level of the inverter of one unit circuit and that of the other unit circuit are different from each other by 30% or more.

FIG. 3 shows another exemplary value of the threshold voltage of each transistor in FIG. 1. As illustrated in FIG. 3, the threshold voltage of each of MP0, MN0 and MN2 is set to be 0.5 V, and the threshold voltage of each of MP1, MN1 and MN3 is set to be 0.2 V. Specifically, transistors having a reduced threshold voltage (despite an increase in the leak current) and a large drive current are used in the right inverter RINV, for which a high speed is required, whereas transistors having an increased threshold voltage and a reduced leak current are used in the left inverter LINV, for which a low speed is acceptable. In this way, the leak current on standby can be reduced to half as compared with a case where all of the transistors used have a low threshold voltage.

Alternatively, the two unit circuits may be asymmetric in terms of the thickness of the gate oxide film, as illustrated in FIG. 4. While the leak current shown in FIG. 3 is an off leak current between the source and the drain of a transistor, what is pronounced in miniaturized transistors is the gate leak current. In view of this, the thickness of the gate oxide film of each of MP0, MN0 and MN2 is set to be 2.6 nm, and the thickness of the gate oxide film of each of MP1, MN1 and MN3 is set to be 1.6 nm, as shown in FIG. 4. Specifically, transistors having a reduced thickness of the gate oxide film (despite an increase in the gate leak current) and a large drive current are used in the right inverter RINV, for which a high speed is required, whereas transistors having an increased thickness of the gate oxide film and a reduced gate leak current are used in the left inverter LINV, for which a low speed is acceptable. In this way, the gate leak current on standby can be reduced to half as compared with a case where all of the transistors used have a thin gate oxide film.

Figure 5:
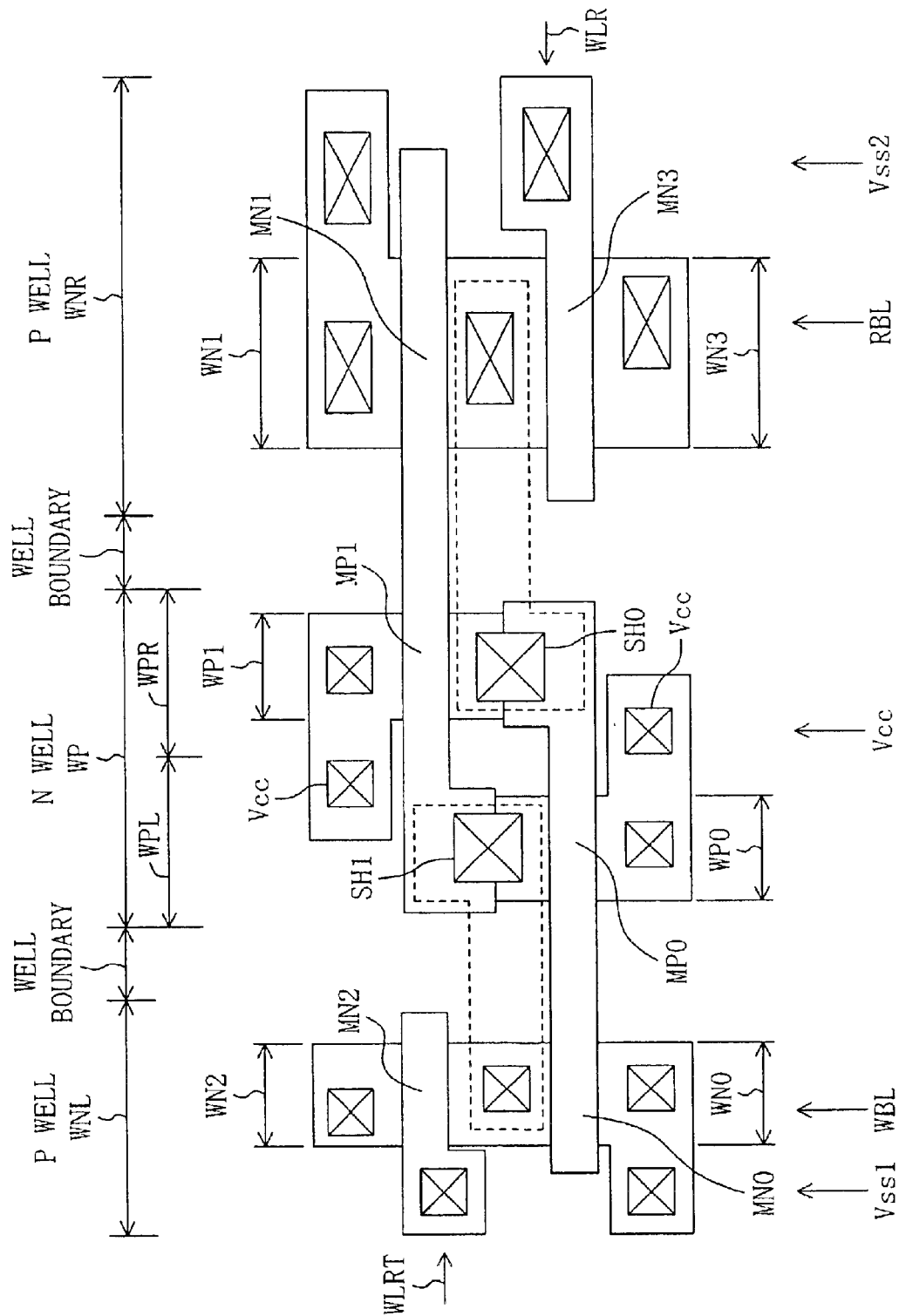
FIG. 5 is a plan view illustrating an exemplary layout of the SRAM device of FIG. 1.

FIG. 5 illustrates an exemplary layout of the SRAM device of FIG. 1. In FIG. 5, WP0, WP1 and WN0 to WN3 denote the gate widths of the transistors MP0, MP1 and MN0 to MN3, respectively, and SH0 and SH1 each denote a shared contact for cross-coupling the transistors. The illustrated layout employs the lateral-type cell structure described above, in which the first unit and the second unit are arranged independently on the left and on the right with the same height and different widths. In FIG. 5, WP denotes the width of the region that is occupied by MP0 and MP1, WNL the width of the region that is occupied by MN0 and MN2, and WNR the width that is occupied by MN1 and MN3. These widths can be determined independently of one another. WP is divided into WPL and WPR denoting the width of the region occupied by MP0 and that of the region occupied by MP1, respectively. These widths also can be determined independently of each other. Note that a longitudinal-type cell structure may alternatively be employed, in which case the channel length of the transistor in one unit and that in the other unit can be set to be different from each other.

Figure 6:
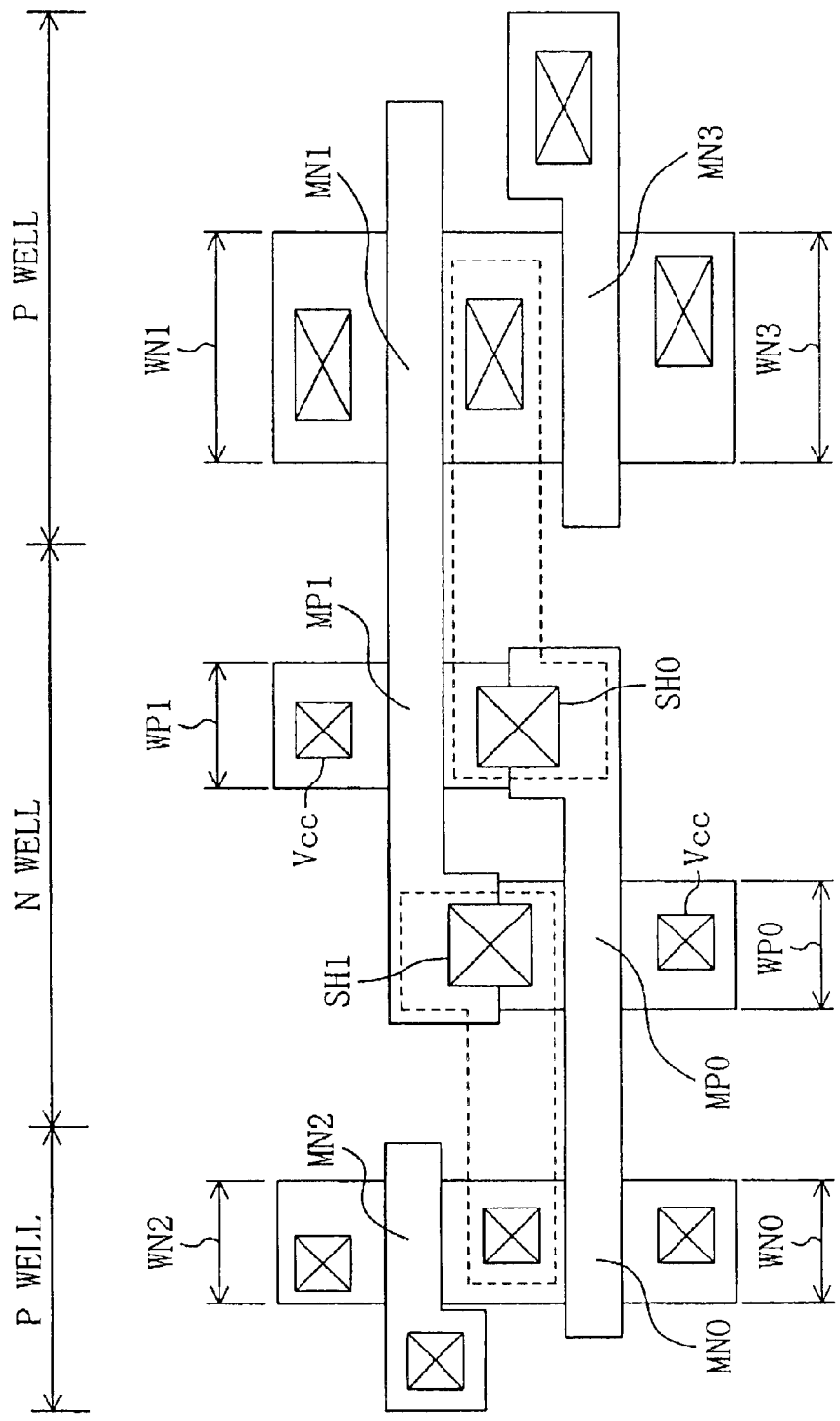
FIG. 6 is a plan view illustrating another exemplary layout of the SRAM device of FIG. 1.

FIG. 6 illustrates another exemplary layout of the SRAM device of FIG. 1. In the layout of FIG. 5, there is a protruding portion in the source region of MN1, for example, whereby the active region in the right-side P well is bent in an L shape. In contrast, in the layout of FIG. 6, MN1 and MN3 have the same channel width and are formed in the same continuous rectangular-shaped active region having straight long sides (with no bent portions). Therefore, the stress in the active region is reduced, thereby preventing a defect from occurring. This also applies to the active region of the left-side P-well region and that of the central N-well region.

An exemplary read/write operation of the SRAM device of FIG. 1 will be described with reference to FIG. 7. As described above, only WLR is activated during a read operation, and WLWT and WLR are both activated simultaneously during a write operation.

During a read operation, the potential of Vss1 is increased by about 0.2 V. In this way, the drive transistor MN0 of the first unit whose gate is connected to the node Vm will not be turned ON even if Vm is increased by 0.4 V.

When writing "L" to the node opposite to Vm, it is written via MN2 having a half size. Basically, the write operation can be done as long as the current driving power of the driver circuit is sufficiently higher than that of MP0. In addition, in the present embodiment, the potential of Vss2 is made to float by about 0.2 V in order to realize an even faster write operation. In this way, a high-speed write operation is made possible even with small sized MN2. When writing "L" to the node Vm side, it is written via MN3 having a large size. Therefore, a high-speed write operation can be performed without controlling Vss2. Of course, an even faster write operation can be performed if Vss1 is made to float by 0.2 V.

Figures 7, 8:
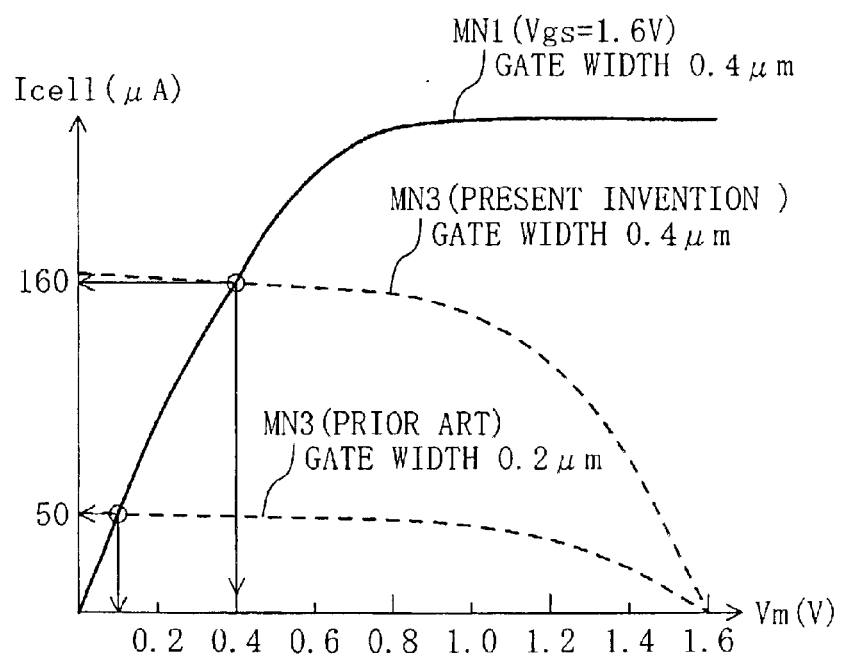
FIG. 7 is a chart for illustrating an exemplary read/write operation of the SRAM device of FIG. 1.
FIG. 8 is a graph showing that a large cell current can be obtained with the SRAM device of FIG. 1.

FIG. 8 shows that a large cell current Icell can be obtained with the SRAM device of FIG. 1. Basically, the capability of pulling a charge out of a bit line is determined by the size of MN1 and MN3, which are connected in series with each other. In the prior art, the channel width of MN3 needed to be smaller than that of MN1 in order to suppress the potential at the node Vm to be as low as 0.1 V. In view of the layout, if MN3 is laid out to be narrower than the gate width of MN1, the P-well region will have a portion with a larger gate width and another portion with a smaller gate width, thereby wasting a space in the portion with a smaller gate width. However, according to the present embodiment, voltages up to 0.4 V can be accepted at Vm, whereby it is possible to increase the gate width of MN3 by utilizing the space that is wasted in the prior art (see FIG. 5). If WN1= WN3 is realized as described above, a cell current as high as 160 µA can be realized, which is more than three times that in the prior art, i.e., 50 µA. This is very advantageous in a case where it is necessary to increase the cell current by setting the size of MN3 and that of MN1 to be as close as possible to each other, or by even making MN3 larger than MN1.

Thus, quantitatively speaking, the SRAM device of FIG. 1 allows the cell area to be reduced to about 80% of that in the prior art, allows the cell leak current to be reduced to one half of that in the prior art, and allows a cell current more than three times that in the prior art to be obtained.

Figure 9:
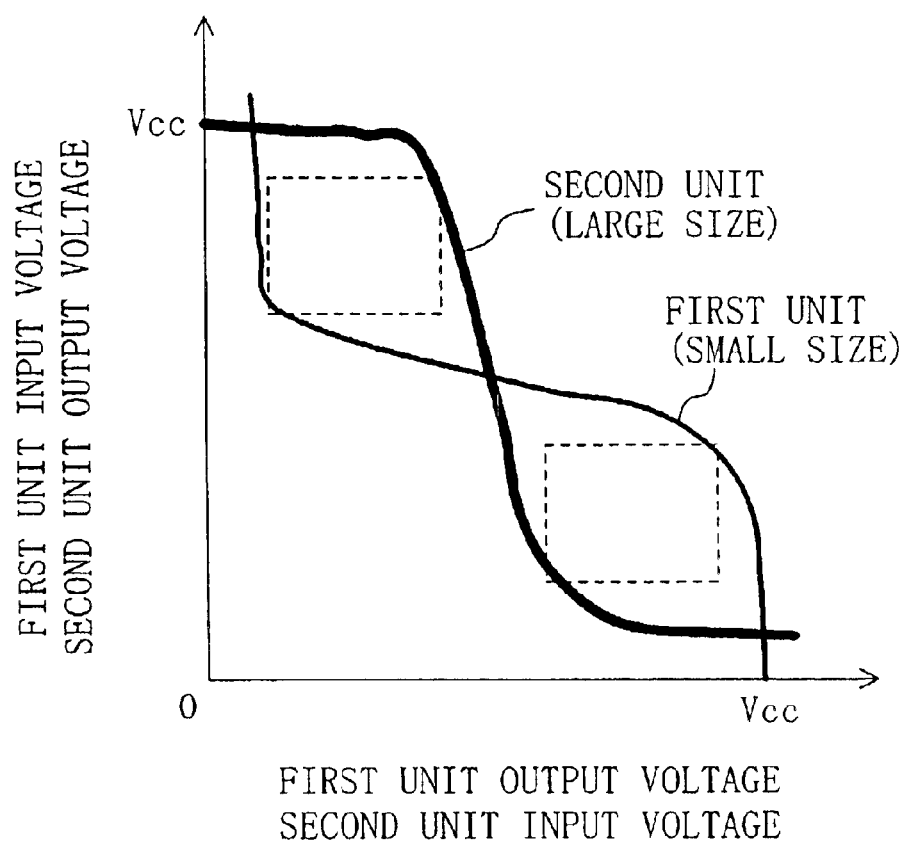
FIG. 9 is a graph illustrating the relationship between the input voltage and the output voltage of an inverter of each of the two units of the SRAM device of FIG. 1, where the inverter of the first unit and the inverter of the second unit are designed with the same size ratio among three transistors.

Note that the gate width of MP1 in FIG. 1 can be increased to be as large as the gate width of MN1 and MN3. In this way, the first unit and the second unit have the same size ratio among the three transistors. FIG. 9 illustrates the relationship between the input voltage and the output voltage of the inverter of each of the two units with such a configuration. FIG. 9 indicates that it is possible to ensure a sufficiently large opening in each wing portion of the butterfly-shaped curves (i.e., to ensure a large area in each broken-line rectangle in FIG. 9). As far as direct currents are concerned, this similarly applies even if the transistor size of the second unit is four times that of the first unit.

What is claimed is:

1. An SRAM device, comprising two unit circuits each including a load transistor, a drive transistor, and an access transistor, wherein the load transistor and the drive transistor together form an inverter and the access transistor connects an output of the inverter to a bit line, with the two unit circuits being coupled to each other by connecting an input and an output of the inverter of one unit circuit with those of the inverter of the other unit circuit in a cross-coupled manner, wherein the drive transistor and the access transistor of one unit circuit have substantially the same channel width, and the channel width is larger than that of the drive transistor and the access transistor of the other unit circuit.

2. The SRAM device of claim 1, wherein a channel width ratio between the load transistor and the drive transistor of one unit circuit and that of the other unit circuit are different from each other by 15% or more.

3. The SRAM device of claim 1, wherein an inversion threshold level of the inverter of one unit circuit and that of the other unit circuit are different from each other by 30% or more.

4. The SRAM device of claim 1, wherein the two unit circuits are asymmetric with each other in terms of a magnitude of an off leak current of the inverter.

5. The SRAM device of claim 1, wherein the two unit circuits are asymmetric with each other in terms of a thickness of a gate oxide film of the constituent transistors.

6. The SRAM device of claim 1, wherein the two unit circuits are asymmetric with each other in terms of a layout area of the constituent transistors.

7. The SRAM device of claim 1, wherein at least one of a lateral size and a longitudinal size of a layout area of one unit circuit can be determined independently of that of the other unit circuit.

8. The SRAM device of claim 1, wherein the drive transistor and the access transistor are formed in the same continuous active region in each of the two unit circuits.

9. The SRAM device of claim 1, wherein a bit line connected to one of the two unit circuits that has a smaller channel width is used only for write operations, whereas a bit line connected to the other unit circuit is used for both read and write operations.

10. The SRAM device of claim 1, wherein the drive transistor and the access transistor are formed in the same continuous rectangular-shaped active region with no bent portions in each of the two unit circuits.

11. An SRAM device, comprising two unit circuits each including a load transistor, a drive transistor, and an access transistor, wherein the load transistor and the drive transistor together form an inverter and the access transistor connects an output of the inverter to a bit line, with the two unit circuits being coupled to each other by connecting an input and an output of the inverter of one unit circuit with those of the inverter of the other unit circuit in a cross-coupled manner, wherein:

- a bit line connected to one of the two unit circuits is used only for write operations, whereas a bit line connected to the other unit circuit is used for both read and write operations;
- a current driving power of at least one of the constituent transistors of one of the unit circuits that is connected to the write-only bit line is set to be lower than that of corresponding one of the constituent transistors of the other unit circuit; and
- the access transistors of the two unit circuits are configured so that only one of the access transistors is activated during a read operation, whereas both of the access transistors are activated during a write operation.

12. An SRAM device, comprising two unit circuits each including a load transistor, a drive transistor, a source line connected to the drive transistor, and an access transistor, wherein the load transistor and the drive transistor together form an inverter and the access transistor connects an output of the inverter to a bit line, with the two unit circuits being coupled to each other by connecting an input and an output of the inverter of one unit circuit with those of the inverter of the other unit circuit in a cross-coupled manner, wherein:

- the two unit circuits are asymmetric with each other in terms of a current driving power of the constituent transistors; and
- the SRAM device further comprises means for setting, during a read operation, a potential level of the source line of one of the two unit circuits of the lower current driving power to be higher than that of the source line of the other unit circuit.

13. The SRAM device of claim 12, wherein the drive transistor and the access transistor have substantially the same channel width in each of the two unit circuits.

* * * * *